United States Patent [19]
Sakurai

[11] Patent Number: 5,488,247
[45] Date of Patent: Jan. 30, 1996

[54] MOS-TYPE SEMICONDUCTOR CLAMPING CIRCUIT

[75] Inventor: Mikio Sakurai, Hyogo, Japan

[73] Assignee: Mitsubishi Denki Kabushiki Kaisha, Tokyo, Japan

[21] Appl. No.: 277,817

[22] Filed: Jul. 20, 1994

[30]     Foreign Application Priority Data

Sep. 21, 1993  [JP]  Japan ................................. 5-234554

[51] Int. Cl.⁶ ........................... H01L 29/78; H02B 1/24; H01H 35/00
[52] U.S. Cl. ................... 257/368; 257/548; 257/928; 327/537; 327/541; 327/546; 327/566; 307/116
[58] Field of Search ........................ 257/368, 548, 257/928; 327/537, 541, 546, 566; 307/116

[56]          References Cited

U.S. PATENT DOCUMENTS 5,251,172  10/1993  Yamauchi ........................... 257/369

*Primary Examiner*—Edward Wojciechowicz
*Attorney, Agent, or Firm*—Lowe, Price, LeBlanc & Becker

[57]          ABSTRACT

A MOS-type semiconductor clamping circuit includes a semiconductor substrate receiving a substrate potential, a well isolated electrically from the substrate potential, and MOS-type transistors formed in the well. Those transistors are connected with each other in series, each transistor has its gate connected to its drain, and a stable potential different from the substrate potential is applied to the well.

10 Claims, 8 Drawing Sheets

MOS-TYPE SEMICONDUCTOR CLAMPING CIRCUIT

BACKGROUND OF THE INVENTION

1. Field of the Invention

The present invention relates to a semiconductor clamping circuit, and more particularly, it is concerned with improvement of stability of a clamping potential in a MOS-type semiconductor clamping circuit.

2. Description of the Background Art

Figure 9:
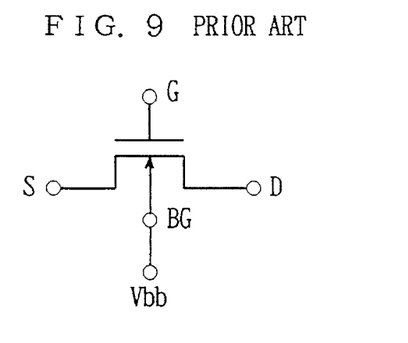
FIG. 9 is a circuit diagram showing an N-MOS transistor.

Referring to FIG. 9, a circuit diagram of an N-channel MOS transistor (referred to as N-MOS transistor hereinafter) is shown. A MOS transistor includes a source terminal S, a gate terminal G, and a drain terminal D. A portion under a channel region between source and drain is called a backgate BG. A potential applied to the backgate region is a so-called bulk potential, and usually a substrate potential Vbb is applied as the bulk potential.

Figure 10:
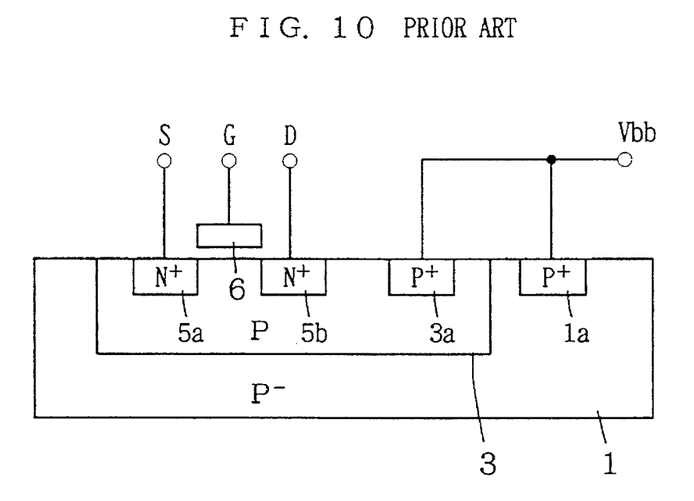
FIG. 10 is a sectional view schematically showing the structure of the N-MOS transistor implemented according to the circuit diagram shown in FIG. 9.

FIG. 10 is a sectional view schematically showing an example of the structure of the N-MOS transistor as represented by the circuit diagram of FIG. 9. In the structure shown in FIG. 10, a P$^-$-type semiconductor substrate 1 is employed. A P-well 3 is formed within substrate 1, and an N$^+$-type source 5a and an n$^+$-type drain 5b are formed in P-well 3. A gate electrode 6 is provided between source 5a and drain 5b. In such N-MOS transistor, a negative substrate bias potential Vbb is applied to substrate 1 via a P$^+$ connection region 1a and also applied to P-well 3 via a P$^+$ connection region 3a. In other words, substrate potential Vbb is applied as a backgate potential $V_{BG}$ of the N-MOS transistor shown in FIG. 9.

Figure 11:
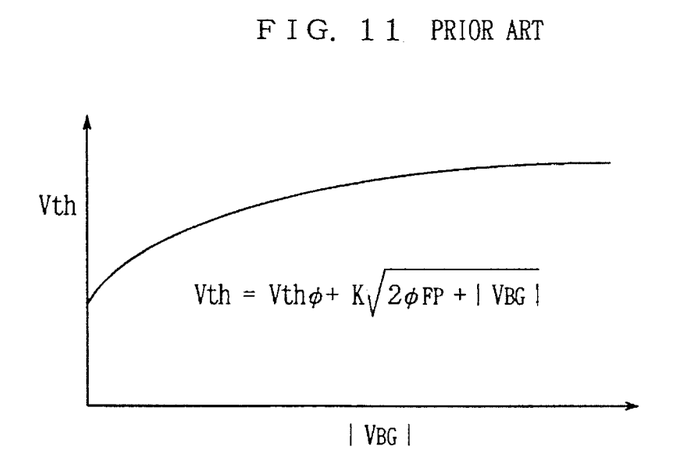
FIG. 11 is a graph schematically showing the relationship between backgate potential $V_{BG}$ and threshold voltage Vth of the MOS transistor.

FIG. 11 is a graph schematically showing the relationship between an absolute value of backgate potential $V_{BG}$ and a threshold voltage Vth of the MOS transistor. More particularly, dependency of threshold voltage Vth upon backgate potential $V_{BG}$ is expressed by $$Vth = Vth\phi + K\sqrt{2\phi_{FP} + |V_{BG}|}$$

where Vth$\phi$ represents a constant, K represents a constant of substrate effect, and $\phi_{FP}$ represents a Fermi level.

Although substrate effect constant K somewhat varies depending on manufacturing process of the transistor, it can be considered to have such a numerical value that threshold voltage Vth changes by 0.1 V as backgate potential $V_{BG}$ changes by 1 V. Such dependency of threshold voltage Vth upon backgate potential $V_{BG}$ cannot be ignored.

Figure 12:
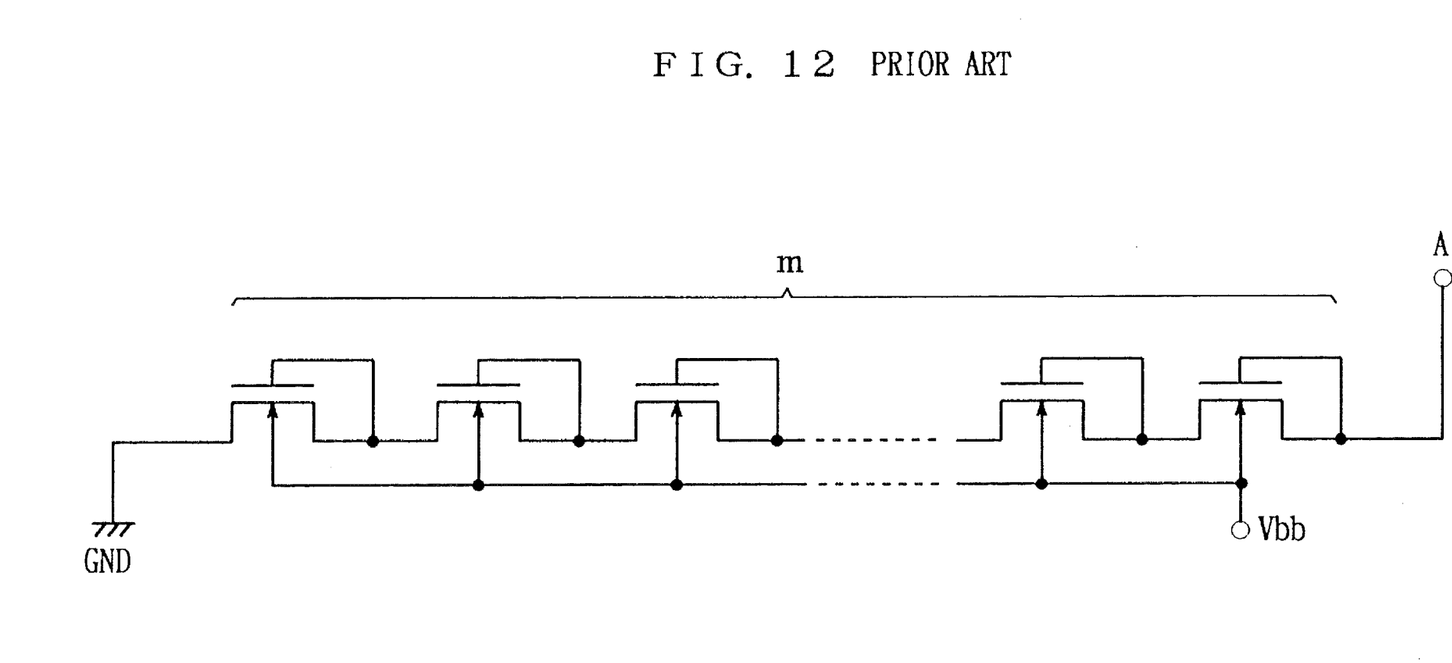
FIG. 12 is a circuit diagram showing one example of a conventional clamping circuit.

FIG. 12 is a circuit diagram showing an example of a clamping circuit including m N-MOS transistors connected in series with each other. In this clamping circuit, each transistor has its gate connected to its drain, and substrate potential Vbb is applied thereto as the backgate potential. Using the clamping circuit, a node A is clamped at a certain potential.

For instance, if each transistor has threshold voltage Vth, when a potential of node A exceeds Vth×m, series-connected transistors allow a current to flow from node A to the ground GND. In other words, the clamping circuit operates so as to keep node A at the potential of Vth×m.

Assume that bulk potential $V_{BG}$ of each N-MOS transistor is changed by $\Delta V_{BG}$. Specifically, assuming that $\delta Vth/\delta V_{GB}=0.1$, m=15, and $\Delta V_{BG}=2$ V, variation $\Delta V_A$ of clamping level $V_A$ at node A is given by $$\Delta V_A = (\delta Vth/\delta V_{BG}) \cdot \Delta V_{BG} \cdot m = 0.1 \times 2 \times 15 = 3 \quad (V)$$

In other words, it results in the fact that clamping level $V_A$ at node A is offset from its design value by as much as 3 V.

As described above, substrate potential Vbb is applied as backgate potential $V_{BG}$ of each MOS transistor in the conventional MOS-type semiconductor clamping circuit, and therefore, threshold Vth of the MOS transistor varies as substrate potential Vbb changes, resulting in the clamping level being offset from the design value.

SUMMARY OF THE INVENTION

In the light of the above-described problems, an object of the present invention is to provide a stable MOS-type semiconductor clamping circuit which can minimize offset of a clamping level.

A MOS-type semiconductor clamping circuit according to the present invention includes a semiconductor substrate receiving a substrate potential, at least one well of first conductivity-type formed in the semiconductor substrate and isolated from the substrate potential electrically, and a plurality of MOS-type transistors each having second conductivity-type source and drain formed in the well, those transistors being connected in series, each transistor having its gate connected to its drain, and a stable potential different from the substrate potential being applied to the well.

In the MOS-type semiconductor clamping circuit according to the present invention, a stable potential which is different from substrate potential Vbb can be applied as backgate potential $V_{BG}$ of each MOS transistor, because the well is isolated electrically from the substrate potential. Consequently, stability of the clamping level is improved significantly, since threshold voltage Vth of the MOS transistor in the clamping circuit does not vary due to the change of backgate potential $V_{BG}$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
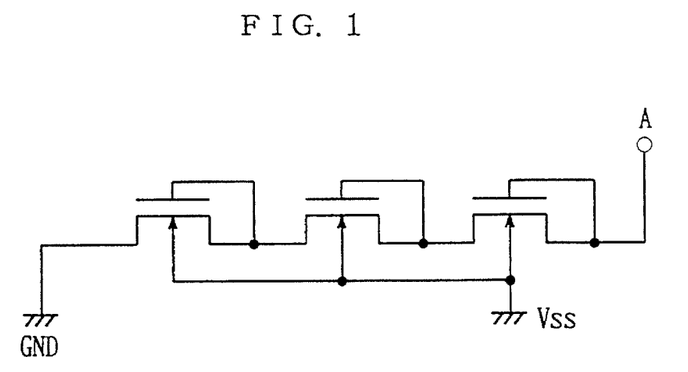
FIG. 1 is a circuit diagram showing a clamping circuit formed by N-MOS transistors according to one embodiment of the present invention.

Referring to FIG. 1, a circuit diagram of a MOS-type semiconductor clamping circuit according to one embodiment of the present invention is shown. The clamping circuit shown in FIG. 1 includes, for the sake of simplicity of the drawing, only three N-MOS transistors. Those N-MOS transistors are connected in series with each other, and each transistor has its gate connected its drain. A transistor on the right end has its drain connected to a clamp node A. On the other hand, a transistor on the left end has its source connected to a stable low power supply level Vss which is usually a ground potential GND.

A characteristic of the clamping circuit shown in FIG. 1 is that a stable low power supply level Vss is applied as backgate potential $V_{BG}$ of each N-MOS transistor, and the stable low power supply level Vss may be ground potential GND. Since backgate potentials $V_{BG}$ of all N-MOS transistors are kept at stable ground potential GND in such clamping circuit, threshold voltages Vth of all N-MOS transistors can be maintained stably, and consequently deviation of clamping potential $V_A$ at node A can be prevented.

Figure 2:
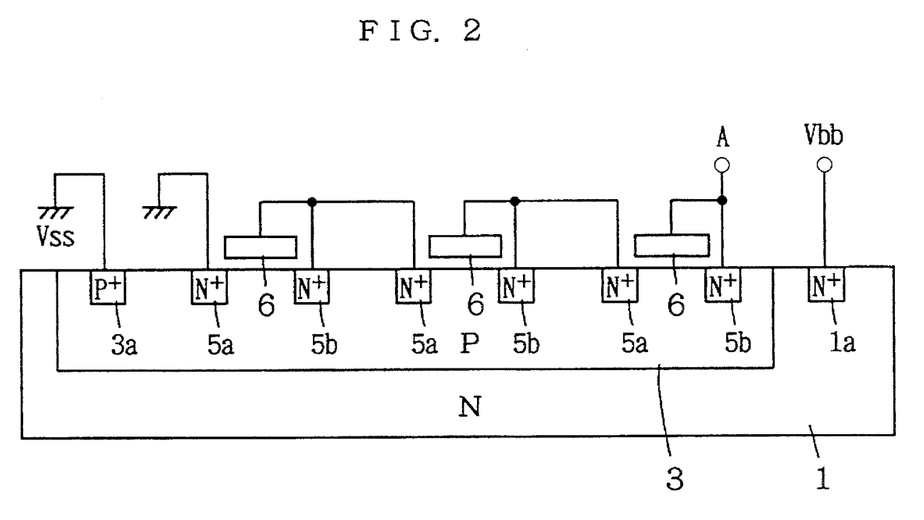
FIG. 2 is a sectional view schematically showing the structure of a clamping circuit implemented according to the circuit diagram shown in FIG. 1.

FIG. 2 is a sectional view schematically showing an example of the structure of the clamping circuit implemented according to the circuit diagram shown in FIG. 1. In the structure shown in FIG. 2, a P-type well 3 is formed in an N-type semiconductor substrate 1. Three N-MOS transistors are formed connected in series in P-type well 3. Each N-MOS transistor includes an N⁺ source 5a, an N⁺ drain 5b, and a gate electrode 6 provided therebetween. Each transistor has its gate electrode 6 connected to its drain 5b. A transistor on the left end has its source 5a connected to low power supply level Vss which is usually ground potential GND, while a transistor on the right end has its drain 5b connected to a clamp node A.

P-well 3 is connected to low power supply level Vss via a P⁺ connection region 3a, and the low power supply level Vss may be ground potential GND. On the other hand, N-substrate 1 is connected to substrate potential Vbb via an N⁺ connection region 1a. More particularly, in the clamping circuit shown in FIG. 2, stable ground potential GND is applied via P-well 3, rather than substrate potential Vbb, as backgate potential $V_{BG}$ of each N-MOS transistor. This stabilizes threshold voltages Vth of the N-MOS transistors, resulting in stabilization of clamp level $V_A$ of node A.

P-well 3 should be isolated electrically from N-substrate 1 in order to apply stable ground potential GND, which is different from substrate potential Vbb, as backgate potential $V_{BG}$ of the N-MOS transistor. In other words, P-well 3 and N-substrate 1 should be isolated by a PN junction therebetween. In this respect, in the clamping circuit shown in FIG. 2, a positive potential should be applied as substrate potential Vbb. A stable high power supply level Vcc may be used as such positive substrate potential Vbb.

Figure 3:
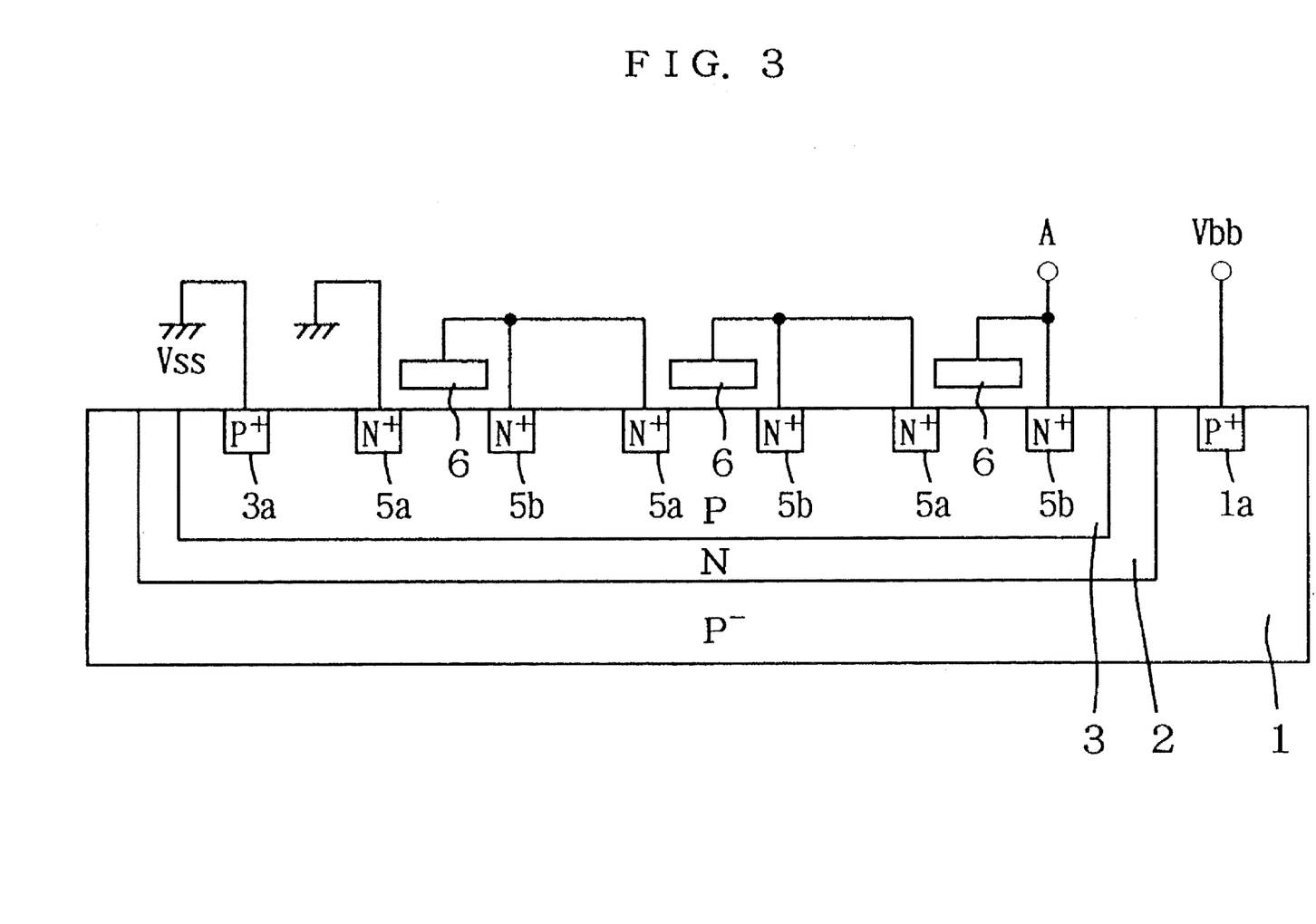
FIG. 3 is a sectional view showing the structure of another clamping circuit implemented according to the circuit diagram shown in FIG. 1.

FIG. 3 is a sectional view showing the structure of another clamping circuit implemented according to the circuit diagram shown in FIG. 1. The clamping circuit shown in FIG. 3 is analogous to that shown in FIG. 2 except the structure of the substrate and the well. More particularly, in FIG. 3, an N-well 2 is formed in a P⁻ substrate 1, and a P-well 3 is formed in the N-well 2. In other words, two PN junctions having reverse polarities are provided between P⁻ substrate 1 and P-well 3. Consequently, stable ground potential GND can be applied as backgate potential $V_{BG}$ of the N-MOS transistor via P-well 3, irrespective of the sign of substrate potential Vbb.

Figure 4:
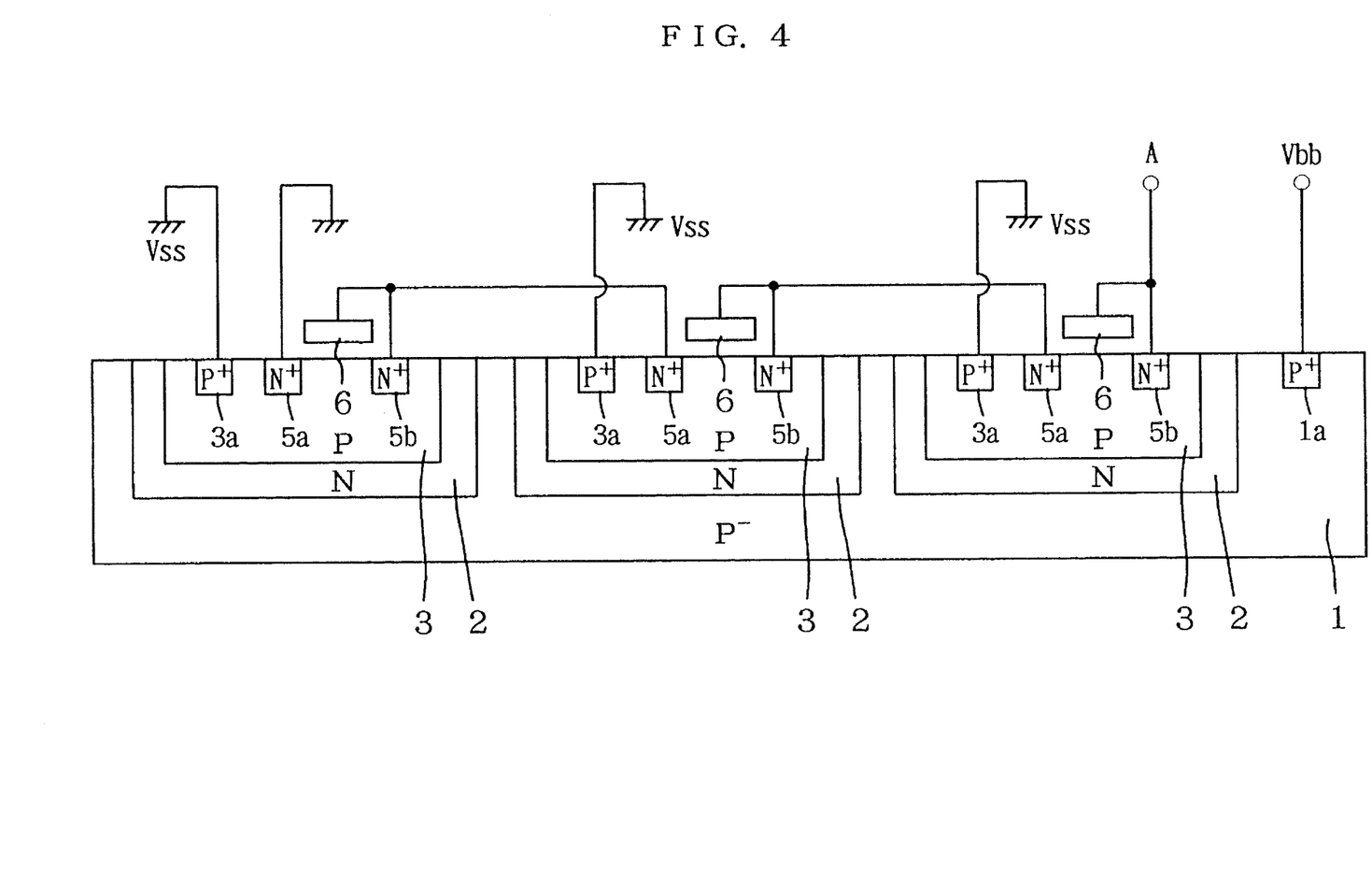
FIG. 4 is a sectional view showing the structure of still another clamping circuit implemented according to the circuit diagram shown in FIG. 1.

FIG. 4 is a sectional view showing the structure of still another clamping circuit implemented according to the circuit diagram shown in FIG. 1. The clamping circuit shown in FIG. 4 is analogous to that shown in FIG. 3 except that the clamping circuit shown in FIG. 4 includes a plurality of P-wells 3 arranged separated from each other. More particularly, each N-MOS transistor is formed in a corresponding P-well 3. In such clamping circuit, ground potential GND can be applied as backgate potential Vbb to all N-MOS transistors, and moreover, a stable potential different from the potential to other transistors can be applied, if desired, as backgate potential $V_{BG}$ for several transistors for fine adjustment of clamping level of node A.

Figure 5:
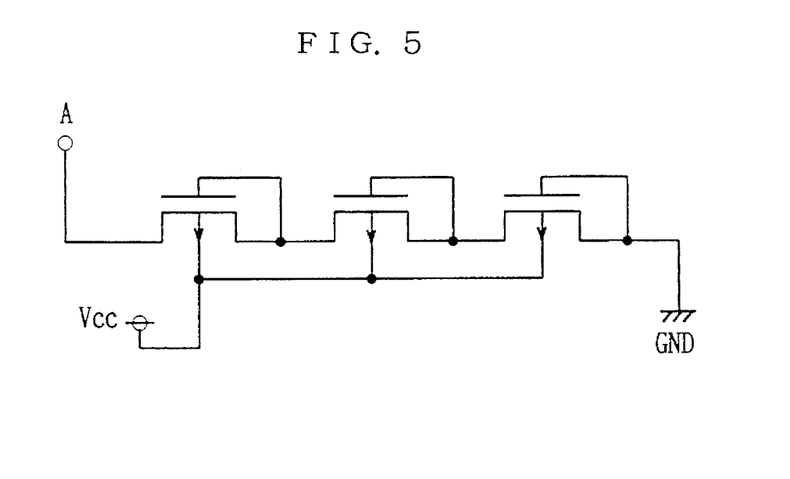
FIG. 5 is a circuit diagram showing a clamping circuit formed by P-MOS transistors according to another embodiment of the present invention.

FIG. 5 is a circuit diagram showing a clamping circuit according to another embodiment of the present invention. Three P-MOS transistors are connected in series in this clamping circuit. Those transistors have respective gates connected to respective drains. A transistor on the left end has its source connected to clamp node A, while a transistor on the right end has its drain connected to low power supply level vss which is usually ground potential GND. A characteristic of this clamping circuit is that stable high power supply level Vcc is applied as backgate potential $V_{BG}$ of each P-MOS transistor. More particularly, variation of threshold voltages Vth of the P-MOS transistors can be restrained by backgate potential $V_{BG}$ applied as stable high power supply level Vcc, resulting in stabilization of clamping level $V_A$ at node A.

Figure 6:
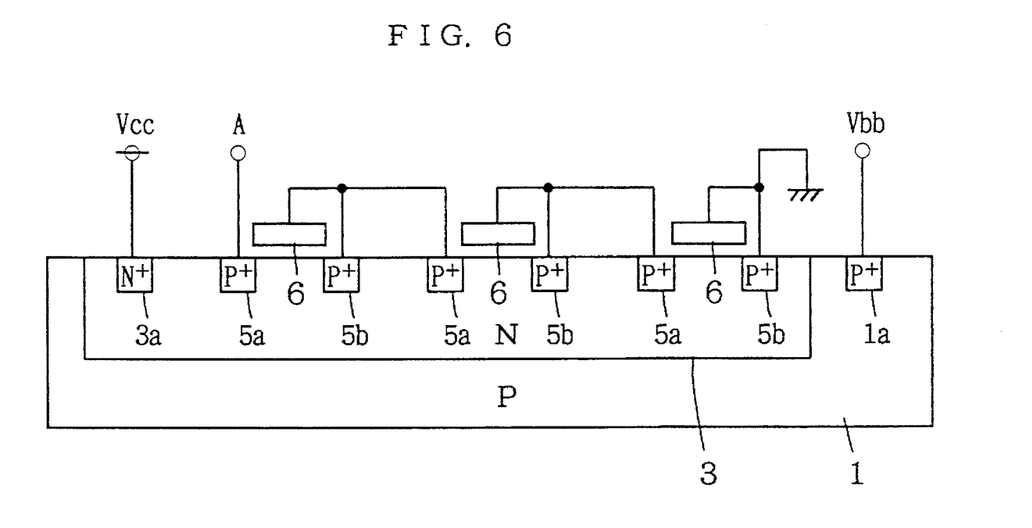
FIG. 6 is a sectional view schematically showing the structure of a clamping circuit implemented according to the circuit diagram shown in FIG. 5.

FIG. 6 is a sectional view schematically showing the structure of the clamping circuit implemented according to the circuit diagram shown in FIG. 5. N-type well 3 is formed in P-type semiconductor substrate 1 in this structure. Three P-MOS transistors are formed connected in series in P-type well 3. Each P-MOS transistor includes a P⁺ source 5a, a P⁺ drain 5b, and a gate electrode 6 provided therebetween. Each transistor has its gate electrode 6 connected to drain 5b. A transistor on the left end has its source 5a connected to clamp node A, while a transistor on the right end has its drain 5b connected to ground potential GND.

Substrate potential Vbb is applied to P-substrate 1 via P⁺ connection region 1a. On the other hand, stable high power supply level Vcc is applied to N-well 3 via N⁺ connection region 3a rather than substrate potential Vbb. In other words, stable high power supply level Vcc different from substrate potential Vbb is applied as backgate potential $V_{BG}$ of the P-MOS transistor in the clamping circuit. Consequently, variation of threshold voltages Vth of the P-MOS transistors can be restrained, resulting in stabilization of clamping level $V_A$ at node A.

N-well 3 and P-substrate 1 should be isolated electrically from each other so that high power supply level Vcc is applied to N-well 3 rather than substrate potential Vbb. More particularly, a reverse-biased voltage should be applied to a PN junction between P-substrate 1 and N-well 3. Therefore, substrate potential Vbb should be at least less than high power supply level Vcc in order to implement the clamping circuit having the structure shown in FIG. 6, and ground potential GND or a negative potential is usually applied as substrate potential Vbb.

Figure 7:
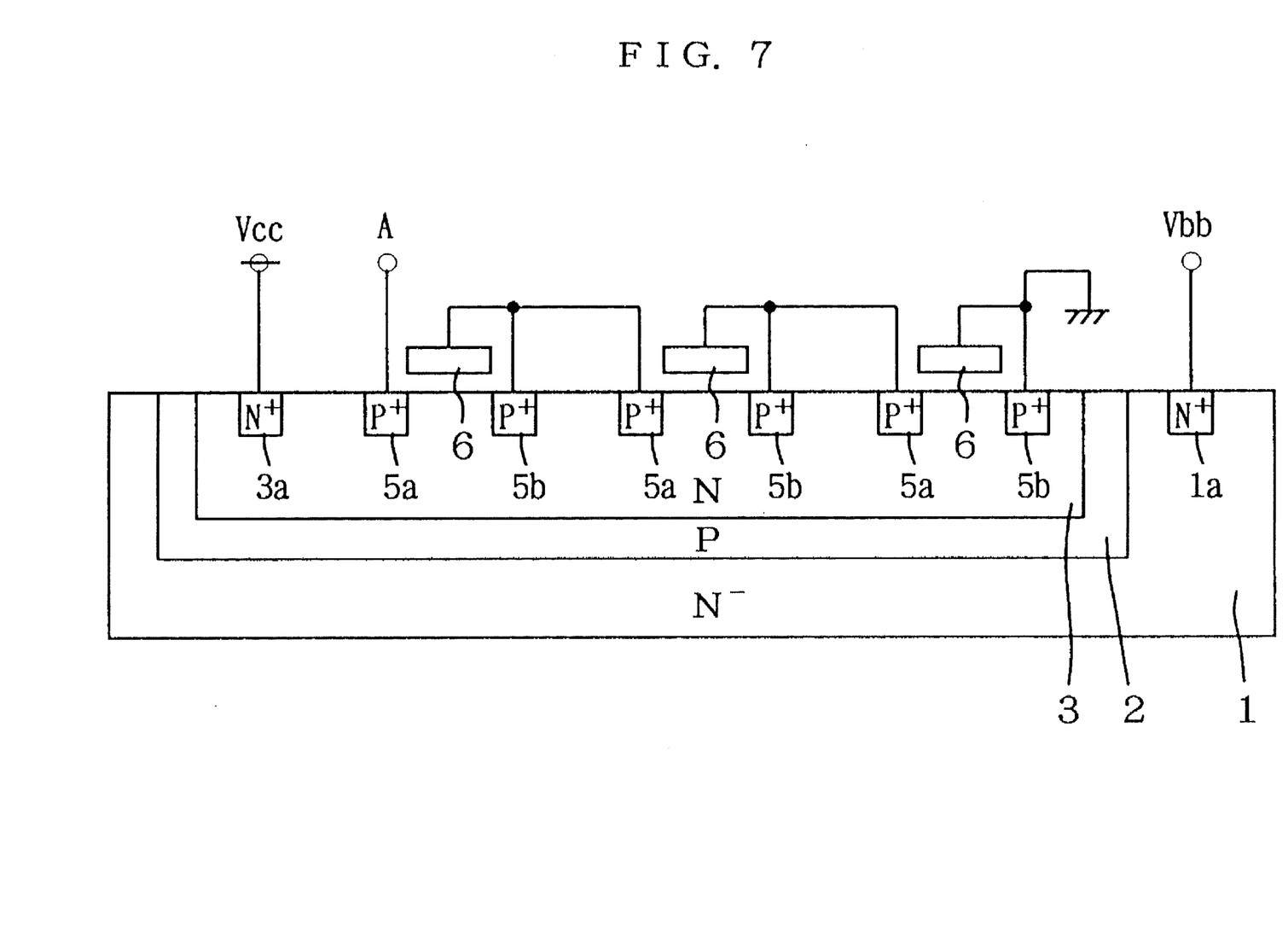
FIG. 7 is a sectional view showing the structure of another clamping circuit implemented according to the circuit diagram shown in FIG. 5.

FIG. 7 is a sectional view showing the structure of another clamping circuit implemented according to the circuit diagram shown in FIG. 5. The clamping circuit shown in FIG. 7 is analogous to that shown in FIG. 6 except the structure of the substrate and the well. More particularly, in the structure shown in FIG. 7, a P-well 2 is formed in N⁻ substrate 1 and an N-well 3 is formed in the P-well 2. As with the clamping circuit shown in FIG. 3, two PN junctions having reverse polarities are provided between substrate 1 and well 3 in the clamping circuit shown in FIG. 7. Consequently, stable high power supply level Vcc can be applied to N-well 3 irrespective of substrate potential Vbb.

Figure 8:
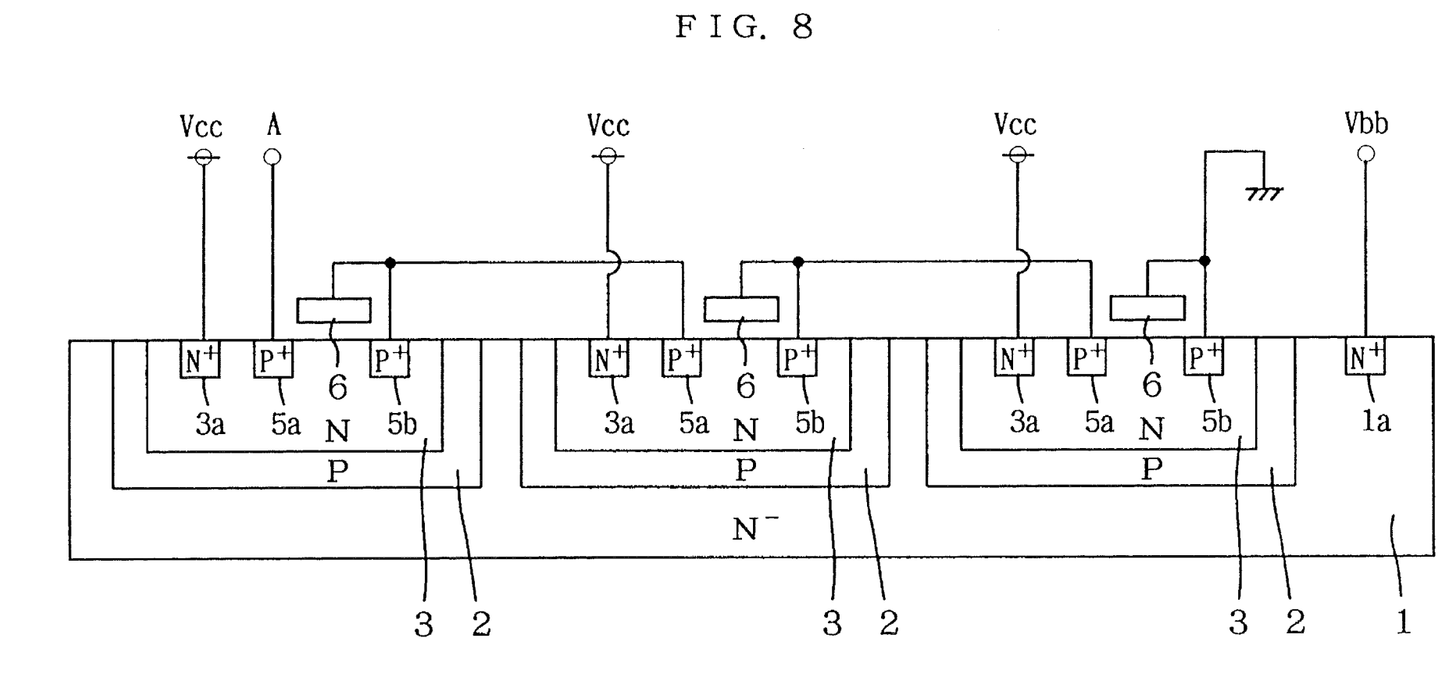
FIG. 8 is a sectional view showing the structure of still another clamping circuit implemented according to the circuit diagram shown in FIG. 5.

FIG. 8 is a sectional view showing the structure of still another clamping circuit implemented according to the circuit shown in FIG. 5. The clamping circuit shown in FIG. 8 is analogous to that shown in FIG. 7 except that each P-MOS transistor is formed in an individual N-well 3. When desired, therefore, it is possible to apply a stable potential different from the potential to other transistors as backgate potential $V_{BG}$ for some of the plurality of P-MOS transistors.

As described above, in the MOS-type semiconductor clamping circuit according to the present invention, the stable potential can be applied as backgate potential $V_{BG}$ of the MOS transistor rather than substrate potential Vbb, because the MOS transistor is formed in the well isolated electrically from the substrate potential. Consequently, variation of threshold voltages Vth of the MOS transistors can be prevented and clamping level $V_A$ at clamp node A can be further stabilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A MOS-type semiconductor clamping circuit, comprising:

a semiconductor substrate receiving a substrate potential;

at least one well of first conductivity type formed in said semiconductor substrate and isolated electrically from said substrate potential; and a plurality of MOS-type transistors each having a source and a drain of second conductivity type formed in said well, each of said plurality of transistors having its gate connected to its drain, those transistors being connected in series with each other, and a stable potential, different from said substrate potential, being applied to said well, providing a constant backgate potential for each of said plurality of MOS-type transistors.

2. The clamping circuit according to claim 1, wherein said substrate is of the first conductivity type, and said well of the first conductivity type is formed in a well of second conductivity type formed in said substrate.

3. The clamping circuit according to claim 1, wherein a separate well is provided for each of said transistors.

4. The clamping circuit according to claim 2, wherein a separate well is provided for each of said transistors.

5. The clamping circuit according to claim 1, wherein said first and second conductivity types are P-type and N-type, respectively, and a ground potential is applied to said first conductivity type well.

6. The clamping circuit according to claim 2, wherein said first and second conductivity types are P-type and N-type, respectively, and a ground potential is applied to said first conductivity type well.

7. The clamping circuit according to claim 3, wherein said first and second conductivity types are P-type and N-type, respectively, and a ground potential is applied to said first conductivity type well.

8. The clamping circuit according to claim 1, wherein said first and second conductivity types are N-type and P-type, respectively, and a stable high level power supply potential is applied to said first conductivity type well.

9. The clamping circuit according to claim 2, wherein said first and second conductivity types are N-type and P-type, respectively, and a stable high level power supply potential is applied to said first conductivity type well.

10. The clamping circuit according to claim 3, wherein said first and second conductivity types are N-type and P-type, respectively, and a stable high level power supply potential is applied to said first conductivity type well.

* * * * *